(12) United States Patent
Kuse

(10) Patent No.: US 11,869,995 B2
(45) Date of Patent: Jan. 9, 2024

(54) SOLAR MODULE COMPRISING A STONE FRAME

(71) Applicant: Kolja Kuse, Munich (DE)

(72) Inventor: Kolja Kuse, Munich (DE)

(*) Notice: Subject to any disclaimer, the term of this patent is extended or adjusted under 35 U.S.C. 154(b) by 0 days.

(21) Appl. No.: 15/566,923

(22) PCT Filed: Apr. 16, 2016

(86) PCT No.: PCT/EP2016/000626
§ 371 (c)(1),
(2) Date: Oct. 16, 2017

(87) PCT Pub. No.: WO2016/165833
PCT Pub. Date: Oct. 20, 2016

(65) Prior Publication Data
US 2018/0233611 A1 Aug. 16, 2018

(30) Foreign Application Priority Data
Apr. 17, 2015 (DE) .................. 20 2015 002 866.7

(51) Int. Cl.
*H02S 30/10* (2014.01)
*H01L 31/048* (2014.01)
(Continued)

(52) U.S. Cl.
CPC ............ *H01L 31/048* (2013.01); *F24S 80/45* (2018.05); *H01L 31/0488* (2013.01);
(Continued)

(58) Field of Classification Search
CPC ....... H01L 31/00–078; Y02E 10/50–60; H02S 20/00–32; H02S 30/10
(Continued)

(56) References Cited

U.S. PATENT DOCUMENTS

| 3,491,530 A | * | 1/1970 | Wilhelm | .................. G04C 3/06 |
| | | | | 368/162 |
| 4,147,107 A | * | 4/1979 | Ringdal | .................. F42B 5/307 |
| | | | | 102/467 |

(Continued)

FOREIGN PATENT DOCUMENTS

| CN | 103382299 | * | 6/2013 |
| DE | 10046126 | * | 4/2002 |

(Continued)

OTHER PUBLICATIONS

DE202012011524 English translation (Year: 2013).*

(Continued)

*Primary Examiner* — Bach T Dinh
(74) *Attorney, Agent, or Firm* — Perry + Currier

(57) ABSTRACT

The invention relates to a new way of stabilizing and mounting solar panels in the form of conventional heat exchangers comprising a trough and a glass cover or of a photovoltaic panel on house walls with the aid of frames made of natural or artificial stones which are made break-resistant using fiber materials and are stabilized in such a way that the panels are also break-resistant on impact and can be mounted as self-supporting structures on a wall; furthermore, the panels in particular satisfy high standards in respect of esthetics and are low-maintenance and thus permanently appealing. Multiple solar panels comprising stone frames can form entire stone-solar panel facades.

6 Claims, 4 Drawing Sheets

Figure 1:
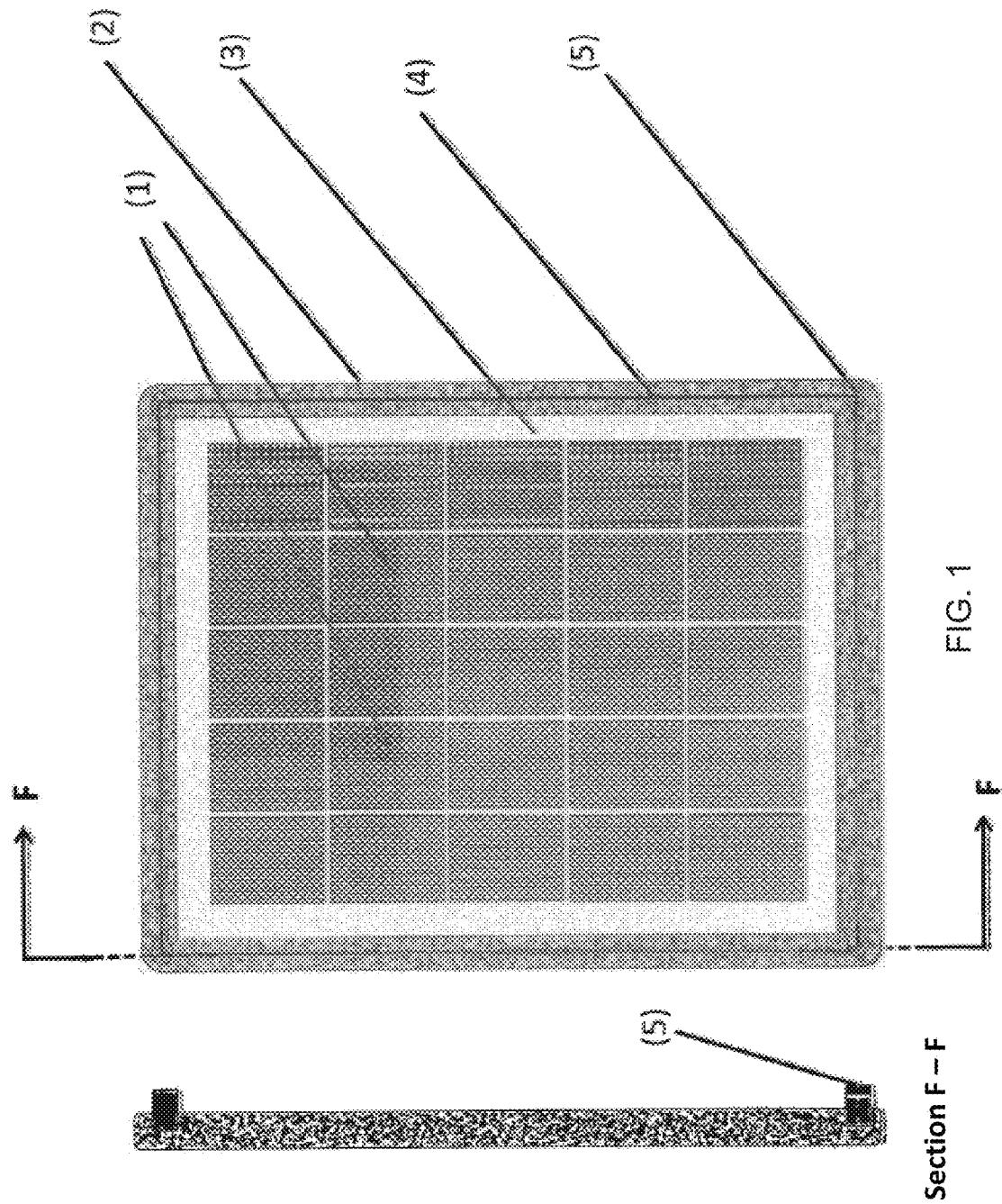

(51) Int. Cl.
*F24S 80/45* (2018.01)
*F24S 80/00* (2018.01)
*F24S 25/60* (2018.01)

(52) U.S. Cl.
CPC ......... *H02S 30/10* (2014.12); *F24S 2025/601* (2018.05); *F24S 2080/012* (2018.05); *F24S 2080/09* (2018.05); *Y02B 10/10* (2013.01); *Y02B 10/20* (2013.01); *Y02E 10/40* (2013.01); *Y02E 10/50* (2013.01)

(58) Field of Classification Search
USPC .................................................. 136/243–265
See application file for complete search history.

(56) References Cited

U.S. PATENT DOCUMENTS

| | | | | |
|---|---|---|---|---|
| 4,421,797 | A | * | 12/1983 | Koehne ............... C04B 28/04 427/403 |
| 4,685,985 | A | * | 8/1987 | Stueke ............... B05D 7/148 427/195 |
| 5,122,861 | A | * | 6/1992 | Tamura ............ H01L 27/14618 257/434 |
| 5,768,831 | A | * | 6/1998 | Melchior ............ H01L 31/048 52/173.3 |
| 2004/0130063 | A1 | * | 7/2004 | Ohta ..................... E04C 5/07 264/228 |
| 2004/0206032 | A1 | * | 10/2004 | Messenger ............ E02D 27/02 52/506.01 |
| 2008/0302030 | A1 | * | 12/2008 | Stancel ................ H02S 20/25 52/173.3 |
| 2014/0060625 | A1 | * | 3/2014 | Beuke ................ H01L 31/0203 136/251 |
| 2016/0040364 | A1 | * | 2/2016 | Kuse ..................... E01B 3/46 238/14.2 |

FOREIGN PATENT DOCUMENTS

| | | | |
|---|---|---|---|
| DE | 102010008600 | * | 8/2011 |
| DE | 202012011524 | * | 5/2013 |
| DE | 112011104781 | * | 10/2013 |
| JP | H084147 A | * | 1/1996 |

OTHER PUBLICATIONS

DE10046126 English translation (Year: 2002).*
JPH084147 English translation (Year: 1996).*
"Vitrimers," Web page <https://en.wikipedia.org/wiki/Vitrimers>, pp. 1-5, Jan. 28, 2022, retrieved from Internet Archive Wayback Machine. <https://en.wikipedia.org/w/index.php?title=Vitrimers&oldid=1068480746> on May 12, 2022.

* cited by examiner

SOLAR MODULE COMPRISING A STONE FRAME

Conventional solar modules have a frame made of synthetic substance, aluminum or other metals, in which thin sheets are bent from, or deep drawn or extruded for example from aluminum. Aluminum is no longer considered to be environmentally friendly, because the mining of bauxite is currently responsible for the production of new aluminum from rainforests, which is very energy-intensive and is loaded with $CO_2$ emissions in the process. Metals generally have the disadvantage that their surface becomes corroded, and soiled, and the surfaces can no longer be cleaned and polished without great effort.

This situation leads to the fact that many solar module systems become unsightly over time and leave a very negative impression. On the roofing this disadvantage is rather insignificant, but on walls and facades, it becomes more than a disturbing occurrence.

For this reason, the invention proposed here goes one step further in the provision of a solar module photovoltaic (PV) or heat exchanger modules with glass cover and tub—a stable frame which is weather-resistant, easy to clean, or is ideally self-cleansing and, above all, still looks beautiful and decorative even after years, and is nevertheless stable.

Under this situation these modules even in private areas of life, hold the promise of a wider market than pure roof installations, which are currently only partially available and is restricted by building regulations and ownership rights. Mobile units that are easily screwed to the wall and are removable when shifting house, are not yet available, but they have opened a wider market. This idea is dedicated to this invention.

If, on the outside of each house, only a single PV solar module with 250 Wp were to be hung somewhere on the wall where it is beautifully portrayed, then for 40 million houses in Germany, this would correspond to an annual electricity output of about 10 million kWh, which corresponds to the power of two mid-sized nuclear power plant blocks.

Annual electricity consumption in Germany is currently around 640 TWh. Realistically, two solar modules per household or apartment could cover approximately 3% of this output.

If even more wall surfaces of the houses were used extensively, all nuclear power plants could be replaced in Germany. Wall surfaces are easier to fit than roofers, as of now the optical effect and the material shortcoming is an obstacle to installing such modules on the wall as aluminum clamps become time worn and the surface becomes unsightly.

This is solved via this invention by the use of a stone frame, the stone being protected against breakages by fiber stabilization. In addition, all facade solutions that are currently made with stone slabs can simply be replaced by the modules described here, and the invention becomes a new facade solution, in that multiple solar modules with stone frames can be shaped out of solar module facades entirely built out of stone.

Figure 2:
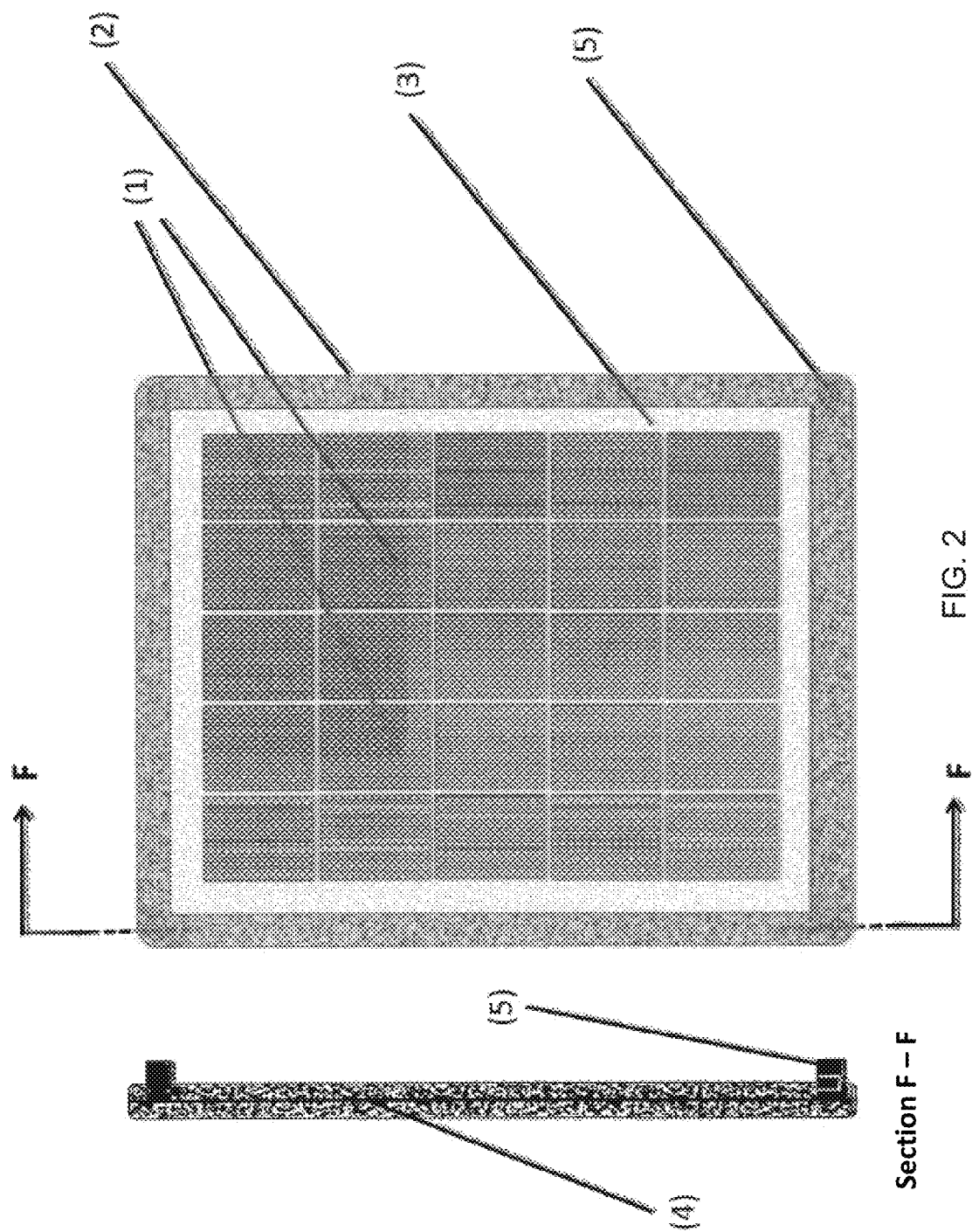
Figure 3:
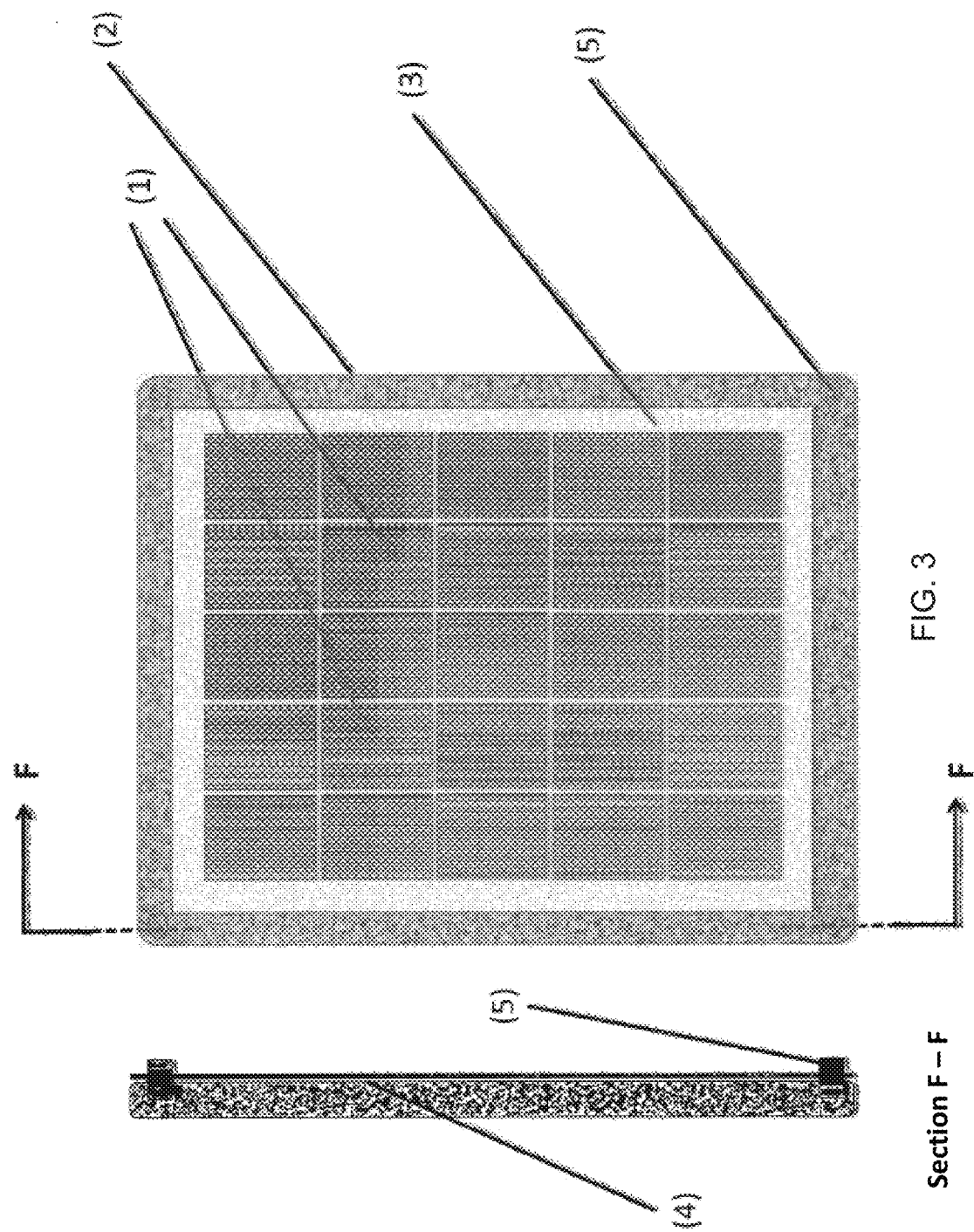
Figure 4:
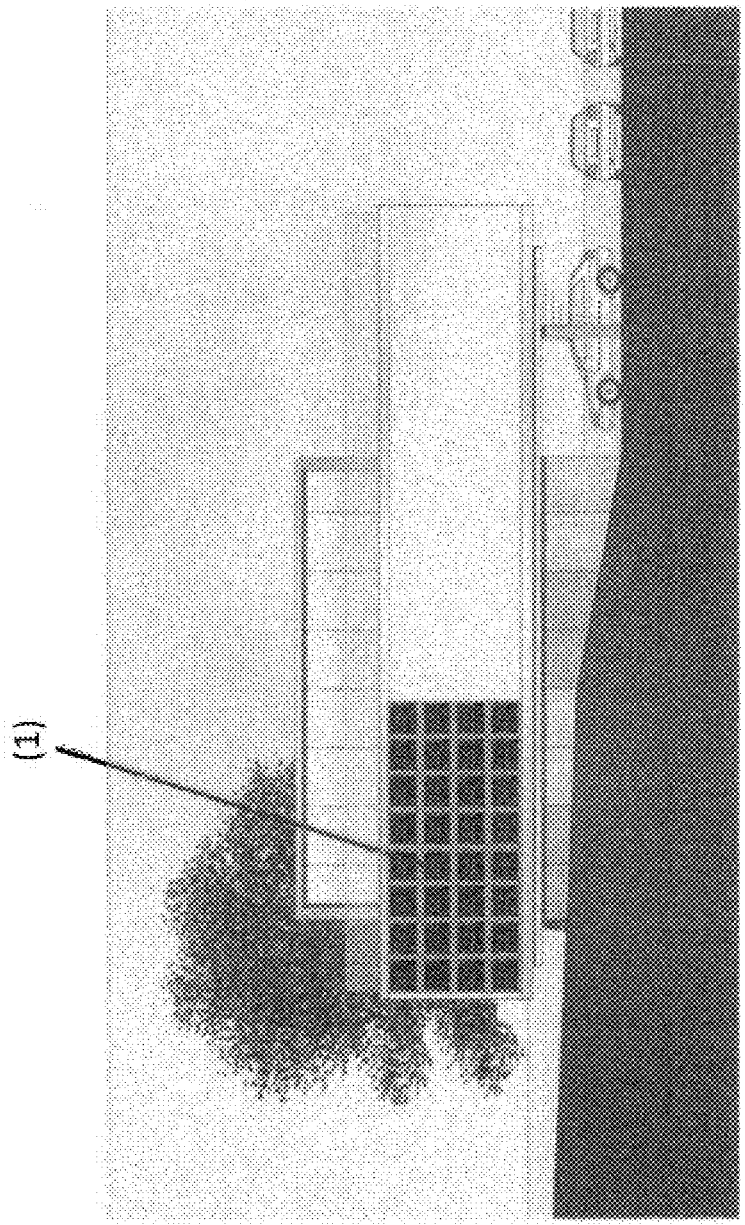

Possible technical designs of a PV solar cell module frame are shown in FIGS. 1 to 3, which illustrate how this frame can be constructed, FIG. 4 shows a complete facade solution.

FIG. 1 shows a glass-glass solar module (1), which is stabilized with a granite frame (2) the frame (2) protects the glass (3) against impact at the edges and simultaneously receives fastening sockets, or fastening sockets or threads (5) made of stainless steel. The frame borders are stabilized with a layer of fiber material (4) in the middle of the stone border, this layer is located in a configuration, which is orthogonal to the level of the module, in the longitudinal orientation in the direction of the border.

FIG. 2 shows a glass-synthetic material solar module (1), which is stabilized with a frame of limestone (2), frame (2) protecting the glass and the synthetic material (3) against impact at the edges and simultaneously receives fastening sockets, or fastening sockets or threads (5) made of stainless steel. The frame borders are stabilized with a layer of fiber material (4) in the middle of the stone border, this layer is located in a configuration, which is parallel to the level of the module, in the longitudinal orientation in the direction of the border.

FIG. 3 shows a glass-glass solar module (1), which is stabilized with a frame of quartzite (2), frame (2) protecting the glass (3) against impact at the edges and simultaneously receives fastening sockets, or fastening sockets or threads (5) made of stainless steel. The frame borders are stabilized with a layer of fiber material (4) at the downside of the stone border, this layer is located in a configuration, which is parallel to the level of the module, in the longitudinal orientation with respect to the direction of the border.

FIG. 4 shows a facade solution (1) of a family house, consisting of several PV-Solar modules.

All three cases can be employed as a fiber layer resin-bonded fiber, consisting of carbon fibers, glass fibers, aramid fibers or stone fibers and these keep the stone material ideally under pre-stress.

The invention claimed is:

1. A planar or arched solar module comprising a heat exchanger or a PV light converter with a sandwich of glass, and plastic or a further glass layer, wherein an edge of the solar module is buttressed with a stone frame consisting of natural stone,
   wherein frame borders are stabilized with a layer of fiber material, said layer of fiber material being within the borders of the stone frame,
   wherein the layer of fiber material is located in an orthogonal configuration to a level of the solar module and in a longitudinal orientation in the direction of the frame border,
   wherein the fiber layer material is a resin bonded fiber selected from the group consisting of carbon fibers, stone fibers, aramid fibers, and a mixture thereof,
   wherein the stone frame is under pre-stress from the fiber layer; and
   wherein the frame is hard-glued to the solar module with duroplastic epoxy resins.

2. The planar or arched solar module of claim 1, wherein the natural stone is selected from the group consisting of granite, limestone and quartzite.

3. The planar or arched solar module of claim 1, wherein the solar module comprises a panel or a tub.

4. The planar or arched solar module of any of claim 1, wherein the stone frame comprises fastening sockets made of stainless steel.

5. The planar or arched solar module of any of claim 1, wherein the frame has mounting arrangements to secure the solar modules with the help of stone frames on walls or other facade fixtures.

6. The planar or arched solar module of any of claim 1, wherein multiple solar modules are formed in a house front.

* * * * *